United States Patent
Paek et al.

(10) Patent No.: US 10,389,298 B2
(45) Date of Patent: Aug. 20, 2019

(54) MULTIPLE CURRENT SOURCE PRIORITIZATION CIRCUIT WITH OVERVOLTAGE PROTECTION

(71) Applicant: Miasole Hi-Tech Corp., Santa Clara, CA (US)

(72) Inventors: Hyung Paek, Burlingame, CA (US); Jia-Jay Liu, Pleasanton, CA (US); Thomas Aquinas Heckel, Mountain View, CA (US); Nicholai Busch, Mountain View, CA (US); Uriel Rosas Rivera, San Jose, CA (US); James Teixeira, San Jose, CA (US); Nicolas Guerrero, San Francisco, CA (US); Jason Stephen Corneille, San Jose, CA (US); Richard Weinberg, Cupertino, CA (US)

(73) Assignee: Miasole Hi-Tech Corp., Santa Clara, CA (US)

(*) Notice: Subject to any disclaimer, the term of this patent is extended or adjusted under 35 U.S.C. 154(b) by 106 days.

(21) Appl. No.: 15/789,187

(22) Filed: Oct. 20, 2017

(65) Prior Publication Data

US 2019/0081593 A1    Mar. 14, 2019

Related U.S. Application Data

(60) Provisional application No. 62/556,166, filed on Sep. 8, 2017.

(51) Int. Cl.
*H02S 40/38* (2014.01)
*H02J 7/00* (2006.01)

(52) U.S. Cl.
CPC ............. *H02S 40/38* (2014.12); *H02J 7/007* (2013.01); *H02J 7/0029* (2013.01); *H02J 2007/0037* (2013.01); *H02J 2007/0039* (2013.01)

(58) Field of Classification Search
CPC ......... H02S 40/38; H02J 7/007; H02J 7/0029; H02J 2007/0039; H02J 2007/0037
See application file for complete search history.

(56) References Cited

U.S. PATENT DOCUMENTS

| | | | |
|---|---|---|---|
| 8,004,242 B1 | 8/2011 | Purkey et al. | |
| 9,090,253 B2 | 7/2015 | Flath et al. | |
| 9,120,364 B2 | 9/2015 | Reichart et al. | |
| 9,156,359 B2* | 10/2015 | Atluri | B60L 1/00 |
| 9,163,600 B2* | 10/2015 | Neet | F02N 11/04 |
| 9,682,629 B2* | 6/2017 | Saint-Leger | B60L 1/003 |
| 9,878,682 B2* | 1/2018 | Pierce | B60R 16/033 |
| 9,948,136 B2* | 4/2018 | Doane | H02J 7/35 |
| 10,053,035 B1* | 8/2018 | Dixon | B60R 16/033 |
| 10,065,521 B2* | 9/2018 | Henningson | B60L 11/1848 |
| 10,124,794 B2* | 11/2018 | Akuzawa | B60L 58/12 |
| 2007/0023078 A1* | 2/2007 | Palladino | H01L 31/042 136/244 |
| 2013/0144504 A1* | 6/2013 | D'Ambrosio | F02D 45/00 701/102 |

(Continued)

FOREIGN PATENT DOCUMENTS

JP    2007022211 A  *  2/2007

*Primary Examiner* — Naum Levin
(74) *Attorney, Agent, or Firm* — Weaver Austin Villeneuve & Sampson LLP (57) ABSTRACT

Techniques and systems are described that enable multiple current source prioritization with overvoltage protection.

17 Claims, 5 Drawing Sheets

(56) References Cited

U.S. PATENT DOCUMENTS

| | | | |
|---|---|---|---|
| 2014/0095018 A1* | 4/2014 | Atluri | B60L 1/00 |
| | | | 701/36 |
| 2014/0361611 A1* | 12/2014 | Saint-Leger | B60L 1/003 |
| | | | 307/10.1 |
| 2015/0353036 A1* | 12/2015 | Pierce | B60R 16/033 |
| | | | 307/9.1 |
| 2016/0276850 A1* | 9/2016 | Shelton | H02J 7/1415 |
| 2016/0380473 A1 | 12/2016 | Henningson et al. | |
| 2017/0217280 A1 | 8/2017 | Larson et al. | |
| 2018/0009431 A1* | 1/2018 | Akuzawa | B60L 58/12 |

\* cited by examiner

MULTIPLE CURRENT SOURCE PRIORITIZATION CIRCUIT WITH OVERVOLTAGE PROTECTION

CROSS-REFERENCE TO RELATED APPLICATION

This application claims priority under 35 USC § 119 to U.S. Provisional Patent Application No. 62/556,166, filed Sep. 8, 2017, which is incorporated by reference herein in its entirety.

BACKGROUND

In a vehicle, the alternator is a source of DC current for providing power to vehicle electronics and to charge onboard batteries. However, the alternator represents a mechanical load on the internal combustion engine and therefore impacts fuel economy. Vehicle operators are deploying systems that augment the alternator with additional current sources, such as solar.

Concurrently using multiple current sources, such as a solar panel and an alternator, when charging a vehicle battery can produce inconsistent results in terms of power delivery and final battery voltage if not properly controlled. If the battery voltage is not properly managed, the battery can be overcharged or undercharged, resulting in reduced battery life and capacity.

SUMMARY

One aspect of the subject matter described herein relates to circuit that prevents a battery from charging to a voltage above a first voltage setpoint for a first voltage regulator. The circuit includes a first input configured to interface to an alternator having the first voltage regulator, a second input configured to interface to a solar panel having a second voltage regulator, a first output configured to interface to the battery having a charge/discharge current and to a load having a load current, first circuitry configured to detect that the alternator is in a first state, the first state corresponding to the first voltage setpoint for the first voltage regulator, and second circuitry configured to: when the first circuitry represents that the alternator is in the first state, set the second voltage regulator to a second voltage setpoint higher than the first voltage setpoint; and set a first current limit at an output of the second voltage regulator below the load current, where: a first current at the first output includes an amount of current from the solar panel corresponding to the first current limit.

The second voltage setpoint may be set high enough to provide a margin against observed or potential voltage noise. In some implementations, is higher than the first voltage setpoint by at least 0.2 volts or at least 0.5 volts. In some implementations, the first circuitry includes at least one of: a vehicle seat occupancy sensor, a current sensor, an ignition switch sensor, a controller area network bus interface, an engine RPM sensor, a mass air flow sensor, a fuel flow sensor, an O2 sensor, an oil pressure sensor, a sensor configured to detect a PWM signal from fuel injectors, a sensor configured to detect electrical noise detected on 12/24 volt system from an ignition coil, a frequency sensor, a speed sensor, a sensor configured to detect a threshold battery voltage, and a sensor configured to detect a signal between the alternator and a control module interface. In some implementations, the second circuitry is further configured to, when the first circuitry represents that the alternator is not in the first state, set the second voltage regulator to a third voltage setpoint, the third voltage setpoint being lower than the second voltage setpoint. In an example implementation, the first voltage setpoint is about 14.0 volts, the second voltage setpoint is about 14.6 volts, and the third voltage setpoint is about 13.8 volts.

In some implementations, the circuit further includes a third input configured to interface to a third current source having a third voltage regulator; where the second circuitry is further configured to, when the first circuitry represents that the alternator is in the first state, set the third voltage regulator to a third voltage setpoint higher than the first voltage setpoint and lower than the second voltage setpoint. In some implementations, the second circuitry is further configured to, when the first circuitry represents that the alternator is not in the first state, set a second current limit at an output of the second voltage regulator, the second current limit being above the load current.

In some implementations, the second circuitry further includes a diode and a switch arranged in parallel, the diode and the switch being positioned between the second voltage regulator and the battery. The second circuitry may be further configured to, when the first circuitry represents that the alternator is not in the first state, open the switch.

In some implementations, the solar panel corresponds to a solar cell array mounted on a vehicle. The solar cell array may be a thin film flexible array. In some implementations, the first state corresponds to an amount of current from the alternator that is greater than a threshold such as 0.1 or 0.5 amperes. In other implementations, a threshold of at least 1 ampere, 2 amperes, etc. to ensure that the current source is active.

In some implementations, the second circuitry is integrated into a solar charge controller coupled to the solar panel. In some implementations, the second circuitry is integrated into a vehicle electronics system. In some implementations, the solar panel is sized to have a maximum current output below a minimum value of the load current. In some implementations, the circuit further includes third circuitry configured to monitor an increased current generated by the alternator, the increased current generated by the alternator corresponding to an increased load current. The second circuitry may be further configured to set a second current limit at an output of the second voltage regulator below the increased load current, where a second current at the first output includes an amount of current from the solar panel corresponding to the second current limit. Implementations of the described techniques may include hardware, a method or process, or computer software on a computer-accessible medium.

Another aspect of the subject matter described herein relates to a system including: an alternator having a first voltage regulator; a solar panel having a second voltage regulator; a battery having a charge/discharge current; a load having a load current; a first output configured to interface to the battery and the load; first circuitry configured to detect that the alternator is in a first state, the first state corresponding to the first voltage setpoint for the first voltage regulator; and second circuitry configured to: when the first circuitry represents that the alternator is in the first state, set the second voltage regulator to a second voltage setpoint higher than the first voltage setpoint; and set a first current limit at an output of the second voltage regulator below the load current, where: a first current at the first output includes an amount of current from the solar panel corresponding to the first current limit.

Another aspect of the subject matter described herein relates to a vehicle including the systems described herein.

These and other aspects are described further below with reference to the drawings.

DETAILED DESCRIPTION

This disclosure describes systems and techniques for prioritizing the current output of concurrently operating current sources. For example, when a solar panel and an alternator are both outputting current to the same battery load and electrical load, the current draw from a solar panel can be maximized while the current draw from an alternator can be minimized. Further disclosed are systems and techniques for continuous battery overvoltage protection. For example, a solar panel can be configured to have different voltage and current profiles based on whether an alternator is on or off.

In a system with two or more charging sources, the output current of each source can be determined to create the most efficient system. The voltage setpoint of each source can then be used to determine the sequence that each source will stop to contribute.

For example, when only one source is providing current, if the output current of the one source is limited to an amount less than an electrical load current, a battery voltage will drop since there is net current leaving the battery. Therefore, a particular voltage setpoint for a voltage regulator for the one source set at any value that is both supported by the voltage regulator and higher than the existing battery voltage will not be reached.

As a further example, when two sources are providing a combined current slightly greater than the electrical load current, the battery can be charged, and either the first or second source can be configured to regulate the final battery charge voltage. For example, configuring the voltage regulator for the second source to have a lower voltage setpoint than the voltage setpoint for the voltage regulator for the first source, and configuring the first source to have a current limit lower than the electrical load current, the lower voltage setpoint regulates the final battery charge voltage. This is because once the lower voltage setpoint is reached, the portion of the combined current from the second source decreases, and the remaining current, corresponding to current from the first source, is limited to being below the electrical load current. As a result, the battery no longer has a net charge current and the battery voltage does not continue rising.

In contrast, without configuring the first source to have a current limit lower than the electrical load current, the battery voltage can continue to rise and a higher voltage setpoint for the voltage regulator for the first source can regulate the final battery charge voltage. If the higher voltage setpoint exceeds the rated voltage for the battery, the overvoltage condition may damage the battery life/capacity.

As described herein, limiting the current of one source to below an electrical load current allows the one source to maximize its current contribution while allowing another source to regulate a battery voltage. In some implementations, current sensing enables one source to operate with a particular output voltage setpoint and particular current limit to maximize current contribution while allowing another source to regulate a battery voltage. In certain implementations, using one or more digital signal outputs from a current sensor monitoring one source simplifies source control circuitry and/or firmware for a second source. In various implementations, using a passive device (e.g., diodes, etc.) or an active device (e.g., linear regulators, etc.) simplifies the design of the source. In some implementations the current prioritization circuit can be installed without altering the OEM vehicle hardware and can operate without communicating with the vehicles system.

FIGS. 1A-1D illustrate an example of current source prioritization circuitry operating in different scenarios. The scenarios correspond to an example implementation of a vehicle having a battery that can serve as an energy source for electrical systems on the vehicle. The vehicle has at least two current sources that can act as chargers for the battery, and at least one electrical load connected to the battery. In FIGS. 1A-1D, a solar charge controller acts as the primary source, and an alternator as the secondary source.

Each current source can have a voltage regulator. The voltage regulator may have an internal voltage reference, which can be used when making comparisons between a configured voltage setpoint for the voltage regulator and a voltage detected at the output of the voltage regulator. The voltage regulator can adjust the detected voltage at the output of the voltage regulator, for example, by increasing the current. Increasing the current flowing through a resistive load causes the output of the voltage regulator to increase towards the voltage setpoint. Similarly, increasing the current such that there is a net flow of current into a battery causes the voltage across the battery terminals to increase, and thereby the voltage output of the voltage regulator converges towards the voltage setpoint. The voltage regulator can be implemented using a wide variety of circuit designs that maintain a voltage level. The voltage regulator may use a feed-forward or negative feedback design, and may use electromechanical mechanisms and/or electrical components. The voltage regulator may regulate AC or DC voltages. In some implementations, a current source may have no voltage regulator, and instead, the current source is configured, such as based on the solar panel array design, to not exceed a particular voltage.

A current source may have a current limiter. The current limiter can be implemented using a wide variety of circuit designs that limit a current. As one nonlimiting example, a current limiter can be implemented using a low-value sense resistor, a control circuit, and a pass transistor. As another nonlimiting example, the current limiter can use a P-channel MOSFET as a pass device with a gate voltage controlled by a transistor that amplifies the voltage drop across a sense resistor. It should be appreciated that current limiter circuit designs have associated voltage drops, and in some implementations, the current limiter voltage drops can be compensated for relative to the particular voltage values described herein. In some implementations, a current source may have no current limiter, and instead, the current source is configured, such as based on the solar panel array design, to not exceed a particular current.

The electrical load connected to the battery can correspond to vehicle functions relating to, as nonlimiting examples, engine management, multimedia and heating, ventilation, and air conditioning (HVAC), body electronics, chassis electrification, lighting (exterior and interior), comfort stations, other batteries, industrial or commercial applications such as refrigeration and lift gate subsystems, and so forth. The electrical load connected to the battery draws an electrical load current. The electrical load current can be provided by sources such as the alternator or solar panel or both. When the sources are unable to provide enough current, such as because the alternator is off when igniting the engine, the battery, if sufficiently charged, can output a battery discharge current to provide the electrical load current or a portion of the electrical load current, which in turn will cause the battery voltage to decrease.

It should be appreciated that the battery can act as a battery load on the sources. When the battery is being charged, the battery can draw a battery load current, which acts as a battery charge current, and the source outputs a sufficient current to provide both the electrical load current to the electrical load and the battery load to the battery. It should further be appreciated that the battery load is an electrical load on the sources, but for the description herein, the terms electrical load current and battery load current are used to clarify between current provided to an electrical load coupled to the output of a battery, and current provided to charge the battery load coupled to the output of the source(s), respectively.

FIGS. 1A-1D depict illustrated voltage and current traces for battery voltage, electrical load current, battery load current, solar current, and alternator current for a sequence of vehicle events.

It should be appreciated that the scale of the traces in FIGS. 1A-1D are relative and are not intended to limit the absolute values of time, voltage, and current values. Furthermore, for clarity purposes, voltage and current phenomena corresponding to ripple, jitter, interference, switching, noise, temperature coefficients, hysteresis, fluctuations in irradiance, and so forth, are not depicted. It should also be appreciated that the depicted uniform current output and step transition between charging and non-charging intervals for each current source are for clarity purposes, and the actual current-voltage relationship is determined by the characteristics of the current source. It should further be appreciated that the effects of control loops, such as a microprocessor causing the alternator to have a damped or delayed response to a sudden change in electrical load current to minimize any degradation in the ride experience for vehicle occupants, are not depicted for clarity purposes. It will be understood by those skilled in the art that the scope of the disclosure is not limited by reference to the following illustrative figures. Rather, the scope of this disclosure should be determined with reference to the appended claims.

Figure 1A:
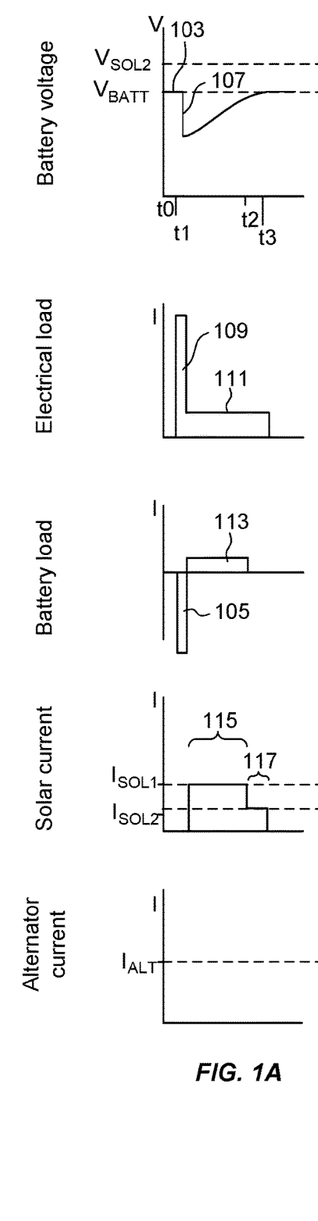
FIGS. 1A-1D are illustrations of example operational scenarios for a multiple current source prioritization circuit with overvoltage protection.

FIG. 1A corresponds to a sequence including vehicle engine ignition with a fully charged battery, turning on the radio, turning off the engine, letting the battery fully charge using only solar current, and then turning off the radio. The vehicle is parked under the sunlight and experiences a uniform irradiance for the corresponding time interval.

At t0, the fully charged battery has initial battery voltage 103 corresponding to a voltage value of VBATT. At t1, when the ignition switch is triggered, such as by turning a key, a starter solenoid can close a pair of contacts for relaying starter discharge current 105 from the battery to a starter motor in order to set the vehicle engine in motion. It should be appreciated that the negative value of the depicted battery load current trace corresponds to a flow of current out of the battery. Because the battery has provided starter discharge current 105, the battery can experience starter voltage drop 107. The starter discharge current 105 can be provided to an electrical load corresponding to the starter motor, as illustrated by the corresponding starter load current 109 having a similar amplitude and time duration. Immediately after t1, the engine is turned off, such as because the vehicle operator has decided not to commence driving. Since the starter motor has already been disengaged, the electrical load current and the battery load current decrease immediately after t1. However, the radio is turned on at t1, and the vehicle electronics continue to consume an electrical load current corresponding to radio load current 111.

Shortly after t1, the solar charge controller can determine that the alternator is off, for example, by sensing the state of a vehicle ignition switch. In some implementations, determining if an alternator is off or on can include determining if the engine is running. In addition to sensing the state of a vehicle ignition switch, examples of determining if the alternator is off include but are not limited to sensing one or more of: engine RPM; mass air flow; fuel flow, oxygen (O2) flow; oil pressure; a PWM signal from fuel injectors, electrical noise on 12/24 volt system from the ignition coil. Further examples include but are not limited to using a frequency switch or sensor with an input signal from a fuel injector, the ignition, or a tachometer, using a speed sensor, detecting a battery voltage greater than 14V (or other threshold voltage dependent on battery type), and intercepting an analog or digital signal between the alternator and Engine Control Module or (Power Train Control Module) interface.

A voltage regulator can be coupled to the solar panel, such as a voltage regulator integrated into a solar charge controller. As a nonlimiting example, the voltage regulator can be a linear shunt regulator, which varies a resistance that is parallel to the electrical load and battery load to shunt a variable amount of current towards ground. For instance, when the voltage setpoint is 14.0 and the detected voltage is 13.5 volts, the voltage regulator can maximize the shunt resistance such that the maximum amount of current from the solar panel is provided to the output of the voltage regulator. When the detected voltage is equal to or exceeds, for example 14.0 volts, the voltage regulator can lower the shunt resistance to shunt all current from the solar panel away from the battery.

Based on detecting no other current sources other than the solar panel, the solar charge controller can be configured to a voltage profile corresponding to setting a voltage setpoint VSOL1 for a voltage regulator for the solar panel to VBATT. In some implementations, VSOL1 can be a slightly lower voltage, such as VSOL1=VBATT−0.3, to provide a voltage margin.

Also based on detecting no other current sources other than the solar panel, the solar charge controller can be configured to have a current profile corresponding to ISOL1, a current limit greater than radio load current 111. The charge current 113, corresponding to ISOL1 minus radio load current 111, can be provided to the battery to raise the battery voltage during charge interval 115. At time t2, the battery voltage has reached the VSOL1 voltage setpoint. Also at t2, the voltage regulator can configure the shunt resistor to divert an amount of current corresponding to charge current 113 towards ground so as to prevent further charging of the battery. The voltage regulator still provides the radio load current 111 at the voltage regulator output to power the radio, as illustrated by the non-charging interval 117. The radio is turned off at t3, in which the electrical load current and the solar current are depicted to decrease to zero.

Therefore, FIG. 1A illustrates how the solar current source can provide current to an electrical load and charge a battery without overcharging the battery.

It should be appreciated that for clarity purposes, electrical loads that may continue to consume current, such as vehicle security systems, are not depicted. Furthermore, for clarity purposes, the battery charging contributions of either the solar panel or the alternator during the brief time period the motor was on is not depicted.

Figure 1B:
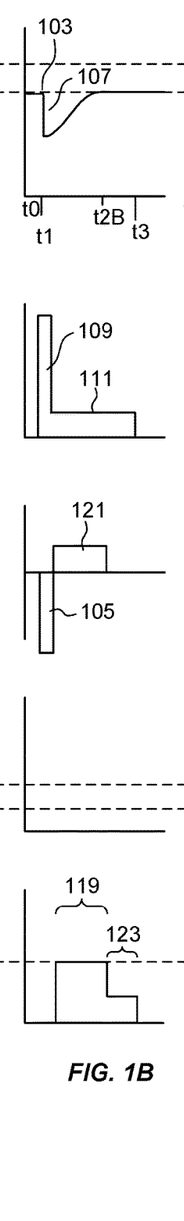

FIG. 1B corresponds to a sequence including vehicle engine ignition with a fully charged battery, keeping the engine on, turning on the radio, letting the battery fully charge using only alternator current, and then turning off the engine and the radio. The vehicle is parked underground; therefore there is no solar current.

The voltage and current traces at times t0 and t1 are interpreted similarly as for FIG. 1A. However, immediately after t1, the engine is kept running, and an alternator can be driven by the engine.

Similar to the solar panel, the alternator can also have a voltage regulator. For example, a voltage regulator can be coupled to an alternator to control the field current applied to the rotor inside the alternator based on the detected voltage at the output of the voltage regulator. For instance, when the voltage setpoint is 14.0 and the detected voltage is 13.5 volts, the voltage regulator will supply field current to the rotor, thereby powering the electromagnets to create a magnetic field. The spinning motion of the magnetic field caused by kinetic energy from, for example, an internal combustion engine or a regenerative braking assembly, induces the alternator to generate current. As the detected voltage converges towards the voltage setpoint, the alternator voltage regulator decreases the field current, such as, for example, reducing pulse width in systems using pulse width modulation (PWM), such that the alternator current output decreases. When the detected voltage exceeds, for example 14.0 volts, the voltage regulator will stop supplying the field current and the alternator will stop generating current. This reduces the amount of work done by, for example, the internal combustion engine to drive the alternator, which in turn improves fuel economy.

The alternator voltage regulator VALT can be an industry standard voltage setpoint, such as VBATT. Shortly after t1, when the radio is drawing current and the battery is drawing current because the battery was previously discharged, the alternator voltage regulator provides a field current to the rotor such that the alternator generates current IALT. Similar to ISOL1, IALT is also greater than radio load current 111 and therefore the radio can be powered and the battery can be charged during charge interval 119 to raise the battery voltage towards VALT. However, as depicted in FIG. 1B, IALT is greater than ISOL1 such that the charge current 121 is greater than charge current 113. As a result, the charge interval 119 for charging using the alternator is a shorter time duration than charge interval 115 when using the solar panel.

At time t2B in FIG. 1B, which occurs earlier than time t2 in FIG. 1A, the battery voltage has reached the VALT voltage setpoint, and the voltage regulator can configure the field current such that the alternator current decreases to a value corresponding to radio load current 111 so as to prevent further charging of the battery. This is illustrated by the non-charging interval 123. The radio and the engine are turned off at t3, in which the electrical load current and the alternator current are depicted to decrease to zero.

Therefore, FIG. 1B illustrates how the alternator current source can provide current to an electrical load and charge a battery without overcharging the battery.

Figure 1C:
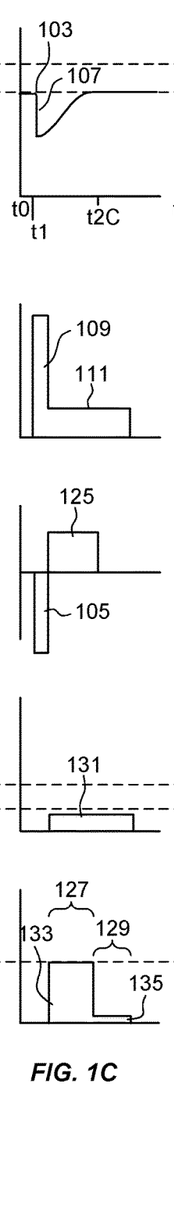

FIG. 1C corresponds to a sequence including vehicle engine ignition with a fully charged battery, keeping the engine on, turning on the radio, letting the battery fully charge using both solar current and alternator current, and then turning off the engine and the radio. The vehicle is parked under the sunlight and experiences a uniform irradiance for the corresponding time interval.

For FIG. 1C, the voltage and current traces at times t0 and t1 are interpreted similarly as for FIG. 1B, and also for immediately after t1, where the engine is kept running so that an alternator can be driven by the engine. In contrast to FIG. 1B, in FIG. 1C, the solar panel also provides a current.

As depicted in FIG. 1C, the alternator voltage regulator setpoint VALT can have a value of VBATT. Shortly after t1, when the radio is drawing current and the battery is drawing current because the battery was previously discharged, the alternator generates current IALT that is greater than radio load current 111. This allows the battery to be charged by the alternator current.

Also shortly after t1, based on detecting that the alternator current exceeds a threshold, such as 0.5 Amps, the solar charge controller can be configured to a voltage profile corresponding to setting a voltage setpoint VSOL2 for the voltage regulator for the solar panel to a value greater than VBATT. In some implementations, VSOL2 can be a voltage such as VSOL2=VBATT+0.5 Volts.

By setting a voltage profile where VSOL2 is higher than VALT, the solar panel voltage regulator shunt resistance is configured to minimize the current being shunted to ground, and the full amount of solar current, up to a current limit specified by a current profile, is output by the solar panel voltage regulator. The solar current 131 output by the solar panel voltage regulator, combined with alternator current 133 having a value of IALT from the alternator voltage regulator, minus radio load current 111, corresponds to battery load current 125 that can be provided to the battery to raise the battery voltage during charge interval 127.

As depicted in FIG. 1C, battery load current 125 is greater than both charge current 113 in FIG. 1A and charge current 121 in FIG. 1B. As a result, the charge interval 127 for charging using both the alternator current and solar current is a shorter time duration than using just alternator current or just solar current. Therefore, by reducing the time duration that the alternator is generating IALT relative to FIG. 1B, fuel economy is improved.

Also based on detecting that the alternator current exceeds a threshold, the solar charge controller can concurrently be configured to have a current profile corresponding to ISOL2, a current limit less than the total electrical load current, which corresponds to radio load current 111 for the scenario depicted in FIG. 1C.

At time t2C in FIG. 1C, which occurs earlier than time t2B in FIG. 1B, the battery voltage has reached the VALT voltage setpoint, and the voltage regulator can configure the field current such that the alternator current decreases and the battery voltage stops increasing. This is illustrated by the non-charging interval 129.

At time t2C, the battery voltage has still not reached the VSOL2 voltage setpoint, which is higher than VALT. Thus, at time t2C, the solar panel voltage regulator can still configure the shunt resistor to minimize the current being shunted to ground such that the full amount of current corresponding to ISOL2 is being output by the solar panel voltage regulator in an attempt to further increase battery voltage. However, because ISOL2 is below the radio load current 111, there will not be a net charge flowing into the battery, and therefore the battery will not continue to be charged to the elevated voltage setpoint of VSOL2.

Thus, by setting a voltage profile where VSOL2 is greater than VALT, and a current profile where ISOL2 is below the electrical load current, the battery is provided overvoltage protection by having VALT control the final battery voltage, while still maximizing the current from the solar panel up to the ISOL2 limit.

In some implementations, during non-charging interval 129, the battery voltage remains stable around VALT as a small alternator current 135 provides the current corresponding to the difference between radio load current 111 and ISOL2 for sufficiently powering the radio.

Therefore, in addition to improving fuel economy because of the shortened charging time, fuel economy is also improved because part of the required radio load current 111 can be provided by the solar current at the current limited value of ISOL2.

The radio and the engine are turned off at t3, in which the electrical load current and the alternator current are depicted to decrease to zero.

In some implementations, when the alternator is turned off, the solar charge controller can change its voltage setpoint to standard charging voltage for the type of battery in use, such as VBATT. This can be accomplished by, for example, using the current signal of the alternator to determine the presence and/or activity of the alternator.

In the example of FIG. 1C, if the vehicle was turned off abruptly during charge interval 127 and the alternator ceases to generate current, the solar charge controller can use the current sensor to detect this condition and drop to a voltage profile of VSOL1, which may be VBATT or slightly lower. This will prevent the battery from being overcharged. In addition to changing the voltage profile, the current profile can be increased to ISOL1 such that there is sufficient current to both charge the battery and power the radio, thereby resulting in reverting to the mode as described for FIG. 1A. It should be appreciated that if the engine is turned back on, the solar charge controller can sense the alternator current and switch back to the VSOL2 and ISOL2 voltage and current profile.

Therefore, FIG. 1C illustrates how both the alternator current source and solar current source can provide current to an electrical load and charge a battery in a fuel saving manner without overcharging the battery, even if the alternator is turned off abruptly. The improved fuel economy arises from both the shortened charging time and the substitution of a portion of alternator current by solar current for powering an electrical load during a non-charging interval.

When the solar panel voltage regulator is set to the elevated voltage setpoint of VSOL2, overvoltage protection is provided by setting ISOL2 to a value such that there is no net charge current to the battery. In some implementations, the value of ISOL2 is not based on directly or indirectly sensing an actual electric load current, but is instead predetermined using the known characteristics of the vehicle. For example, a particular vehicle may have a known minimum electrical load current after the engine is turned on. By setting ISOL2 below this minimum electrical load current when the alternator is detected to be running, overvoltage protection is provided. For example, in the operational scenarios represented by FIGS. 1A-C, if the radio has a current consumption similar to the minimum electrical load current, the fuel economy improvement is optimized. However, if the radio has a current consumption, for example, 3 Amps higher than the minimum electrical load current value that ISOL2 is set to, and the solar panel is capable of providing the extra 3 Amps, the fuel economy improvement is not optimized.

In certain implementations, ISOL2 can be configured using closed-loop feedback. By increasing ISOL2 to just below the actual electrical load current, fuel economy improvements based on a shortened charging interval and alternator current substitution during a non-charging interval are better optimized. For example, the feedback can be used to track both positive and negative changes in the actual electric load current, such as when vehicle accessories are being turned on or off.

In some implementations, during the charging interval, by increasing ISOL2 to just below the actual electrical load current to be closer to the combined electrical load current and battery load current, fuel economy improvements can be further optimized. For example, monitoring the current of a second source, such as the alternator, can be used as feedback to the first source, such as the solar panel, such that the first source can increase its output current until the current of the second source is nominally above 0 amps. This allows the first source to dynamically maximize its current contribution while minimizing the current contribution of the second source.

Figure 1D:
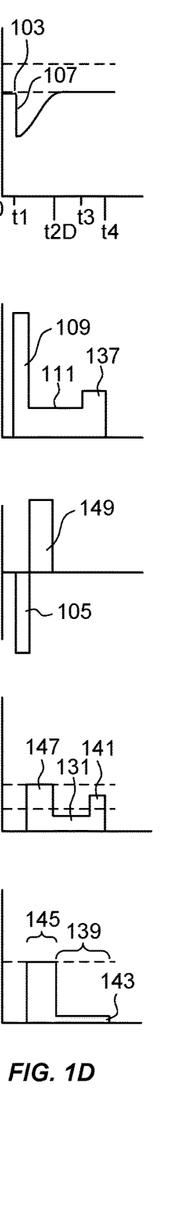

FIG. 1D corresponds to an example implementation using alternator current feedback to modify ISOL2. FIG. 1D corresponds to a sequence including vehicle engine ignition with a fully charged battery, keeping the engine on, turning on the radio, letting the battery fully charge using both solar current and alternator current, turning on the window defrosters, and then turning off the engine, radio, and window defrosters.

For FIG. 1D, the voltage and current traces at times t0 and t1 are interpreted similarly as for FIG. 1C. However, charging interval 145 is shorter than the charge interval 127 for FIG. 1C. Specifically, solar current 147 during charging interval 145 is not limited to being below the electrical load current corresponding to radio load current 111, and therefore the battery load current 149 can be greater than battery load current 125 for FIG. 1C.

In FIG. 1D, the increased solar current for charging the battery arises because the feedback loop is attempting to bring the alternator current down to a threshold of 0.5 amps. To drive down the alternator current, the battery voltage can increase such that the alternator voltage regulator can supply a smaller field to the rotor. The solar charge controller increases the battery voltage by increasing the solar current. In some implementations, the solar current is limited by the current capacity of the solar panel, which as discussed earlier for FIG. 1A is limited to ISOL1.

Since the alternator is operating and therefore the alternator is controlling the battery voltage, the solar charge controller is configured to the VSOL2/ISOL2 profiles. During the charging interval 145, by sensing that the alternator current output has not yet been driven to a low threshold such as 0.5 amps, ISOL2 is increased up to the ISOL1 maximum solar current output value. During the charging interval, improved fuel economy is achieved using the feedback mechanism by further shortening the charging interval 145 relative to FIG. 1C.

Battery charging is completed at t2D, when the battery voltage reaches VALT. At time t2D, ISOL2 is decreased to slightly below the radio load current 111, since the battery load current is zero because the battery has been charged. Non-charging interval 139 of FIG. 1D also differs from non-charging interval 129 of FIG. 1C. Specifically, during non-charging interval 139 of FIG. 1D, the window defrosters are turned on at time t3, and the combined electrical load current of the radio and window defrosters correspond to increased electrical load current 137.

Again, since the alternator is operating and therefore the alternator is controlling the battery voltage, the solar charge controller is configured to the VSOL2/ISOL2 profiles. ISOL2 was previously configured to be slightly below the radio load current 111. If ISOL2 is not increased to slightly below the increased electrical load current 137, the alternator output current will increase. For example, the alternator output current increases because the battery starts to drain faster and the battery voltage drops to the point where the alternator voltage regulator causes the alternator to increase current to re-charge the battery voltage. As another example, the alternator output increases to supply current to the window defrosters.

However, in implementations where ISOL2 can be increased to slightly below the increased electrical load current 137, such as by using feedback from a current sensor at the output of the alternator, the additional current consumed by the window defrosters can be provided by the solar charge controller rather than the alternator. In FIG. 1D, this is illustrated by solar current 141 being elevated to have a value corresponding to ISOL2', and the alternator current 143 remaining flat during non-charging interval 139, which represents no increased loading of the engine by the alternator despite turning on the window defrosters. In this example, ISOL2' is less than ISOL1, the maximum current output of the solar panels.

The radio, window defrosters, and the engine are turned off at t4, in which the electrical load current and the alternator current are depicted to decrease to zero.

In the example of FIG. 1D, similar to FIG. 1C, if the vehicle is turned off abruptly during charging interval 145 and the alternator ceases to generate current, the solar charge controller can use the current sensor to detect this condition and drop to a voltage profile of VSOL1, which may be VBATT or slightly lower. This will prevent the battery from being overcharged. In addition to changing the voltage profile, the current profile can be set to ISOL1. It should be appreciated that if the engine is turned back on, the solar charge controller can sense the alternator current and switch back to the VSOL2 and ISOL2 voltage and current profile.

Therefore, FIG. 1D illustrates how fuel economy improvements can be optimized by minimizing the deviation between ISOL2 and the actual combined electrical load current and battery load current using alternator current feedback. It should be appreciated that because ISOL2 is kept below the actual combined electric load current and battery load current, the overvoltage protection as described herein is still provided.

Figure 2:
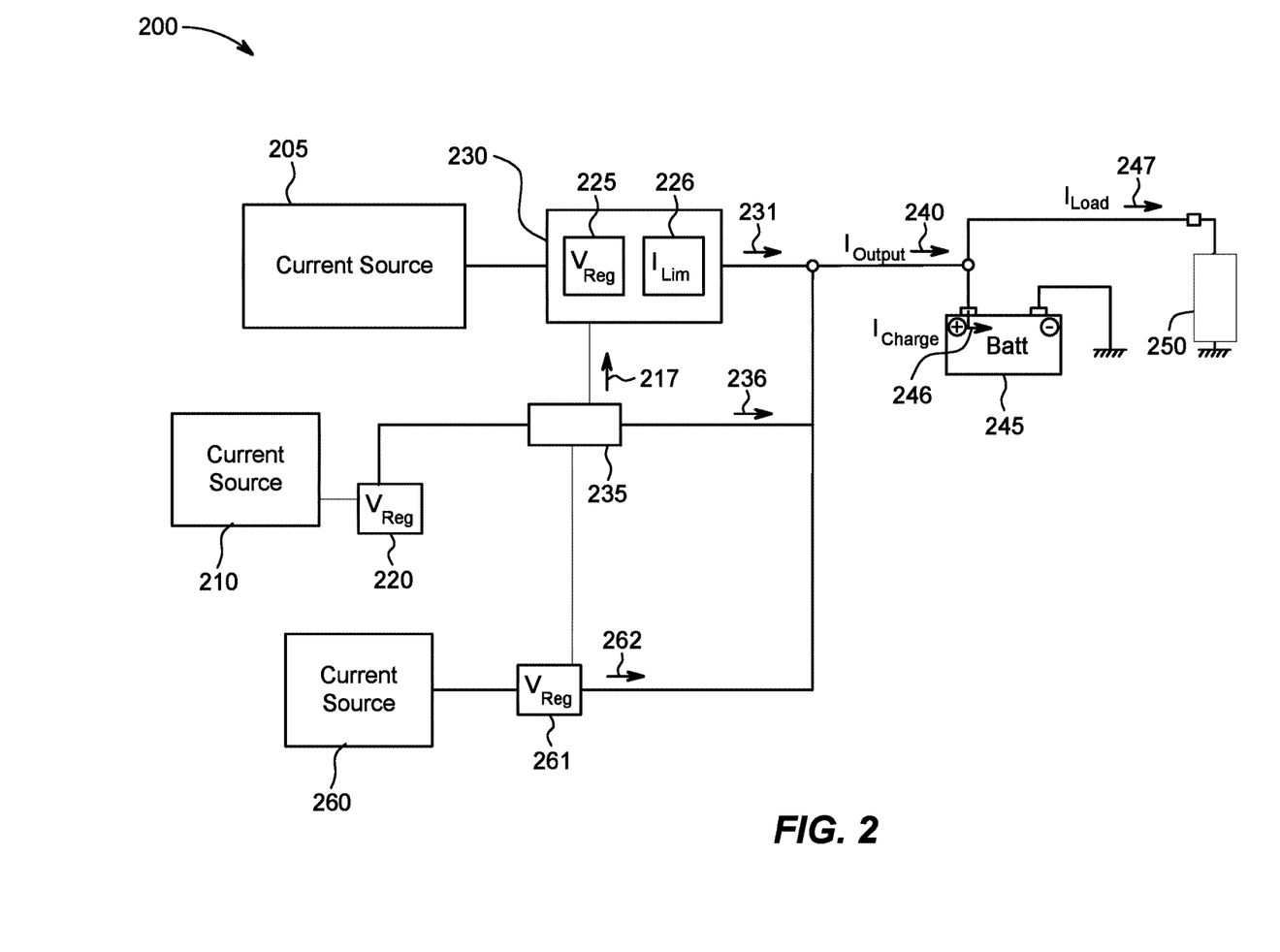
FIG. 2 is a simplified block diagram of a specific implementation of a multiple current source prioritization circuit with overvoltage protection.

FIG. 2 is a simplified block diagram of a specific implementation of a multiple current source prioritization circuit with overvoltage protection. Multiple current source prioritization circuit 200 includes a first input 236 configured to interface to a first current source 210 having a first voltage regulator 220. FIG. 2 also depicts a second input 231 configured to interface to a second current source 205 having a second voltage regulator 225 and a current limiter 226. FIG. 2 further depicts output 240 configured to interface to battery 245 having a charge/discharge current 246 and an electrical load 250 having an electrical load current 247.

FIG. 2 includes first circuitry 235 configured to generate one or more outputs 217 that represent a particular state of first current source 210. For example, the particular states can include a first state corresponding to first current source 210 being active and having a first voltage setpoint for the first voltage regulator 220, and a second state corresponding to first current source 210 being inactive.

FIG. 2 also includes second circuitry 230 configured to respond to when the one or more outputs 217 of first circuitry 235 represents that first current source 210 is in the first state. Second circuitry 230 can respond by setting second voltage regulator 225 to a second voltage setpoint that is higher than the first voltage setpoint. In some implementations, the second voltage setpoint can be higher than the first voltage setpoint by at least 0.5 Volts. This is to provide a margin against voltage noise. For example, a margin of 0.1 Volts may not be sufficient. One having ordinary skill in the art will recognize that the threshold to be sufficiently higher than noise may be lower than 0.5 Volts, e.g., at least 0.2 Volts, 0.3 Volts, or 0.4 Volts.

Second circuitry 230 can also respond by setting current limiter 226 to a first current limit at the output of second voltage regulator 225. In some implementations, the first current limit is below electrical load current 247. When second circuitry 230 is configured with the second voltage setpoint for second voltage regulator 225 and first current limit for current limiter 226, the current at output 240 can include an amount of current from second current source 205 corresponding to the first current limit. Because the first current limit is below the electrical load current 247, multiple current source prioritization circuit 200 does not charge battery 245 to a voltage above the first voltage setpoint associated with first voltage regulator 220 for first current source 210.

In FIG. 2, when one or more outputs 217 of the first circuitry represents that first current source 210 is in a second state, corresponding to being inactive, second circuitry 230 can set second voltage regulator 225 to a third voltage setpoint that is lower than the second voltage setpoint. In some implementations, second circuitry 230 can also set a second current limit for current limiter 226 at the output of second voltage regulator 225 that is above electrical load current 247. When second circuitry 230 is configured with the third voltage setpoint for second voltage regulator 225 and the second current limit for current limiter 226, the current at output 240 can include an amount of current from second current source 205 corresponding to the second current limit. Because the second current limit can be above the electrical load current 247, multiple current source prioritization circuit 200 can charge battery 245 to the third voltage setpoint associated with second voltage regulator 225 for second current source 205. Since the third voltage setpoint is below or equal to the second voltage setpoint, battery 245 is not charged above the second voltage setpoint.

In some implementations, multiple current source prioritization circuit 200 can also include a third input 262 configured to interface to a third current source 260 having a third voltage regulator 261. In such implementations, when first circuitry 235 represents that the first current source and the third current source are active, second circuitry 230 can further be configured to set third voltage regulator 261 to a voltage setpoint higher than the voltage setpoint for first voltage regulator 220 and lower than the voltage setpoint for second voltage regulator 225. In such an example, as battery 245 is being charged, first current source 210 will stop supplying current above a nominal current before third current source 260 because the voltage setpoint for first current source 210 is reached by battery 245 before reaching the voltage setpoint for third current source 260. (The first current source 210 will supply a nominal current to regulate voltage). When the voltage for battery 245 reaches the voltage setpoint for third current source 260, battery 245 is no longer being charged because third current source 260 is no longer supplying current and second current source 205 supplies a current that is less than electrical load current 247. Therefore, third current source 260 and second current source 205 are prioritized over first current source 210, second current source 205 is prioritized over third current source 260, and second current source 205 is current limited to provide battery overvoltage protection.

It should be appreciated that the specific order of prioritization can be determined based on the ordered values of voltage setpoints for each current source. For example, if third voltage regulator 261 is instead set to a voltage setpoint lower than the voltage setpoint for first voltage regulator 220, first current source 210 is instead prioritized over third current source 260. It should further be appreciated that the number of current sources can be increased, and prioritization between current sources can be configured based on ordering voltage setpoints as described herein.

Continuing the example where third current source 260 is included, when one or more outputs 217 of the first circuitry represents that first current source 210 and third current source 260 are both inactive, second circuitry 230 sets second voltage regulator 225 to a voltage setpoint that is safe for battery 245. Second circuitry 230 can also set a second current limit for current limiter 226 at the output of second voltage regulator 225 that is above electrical load current 247. Similar to as described above, this configuration of second current source 205 allows battery 245 to charge while still providing overvoltage protection.

Figure 3:
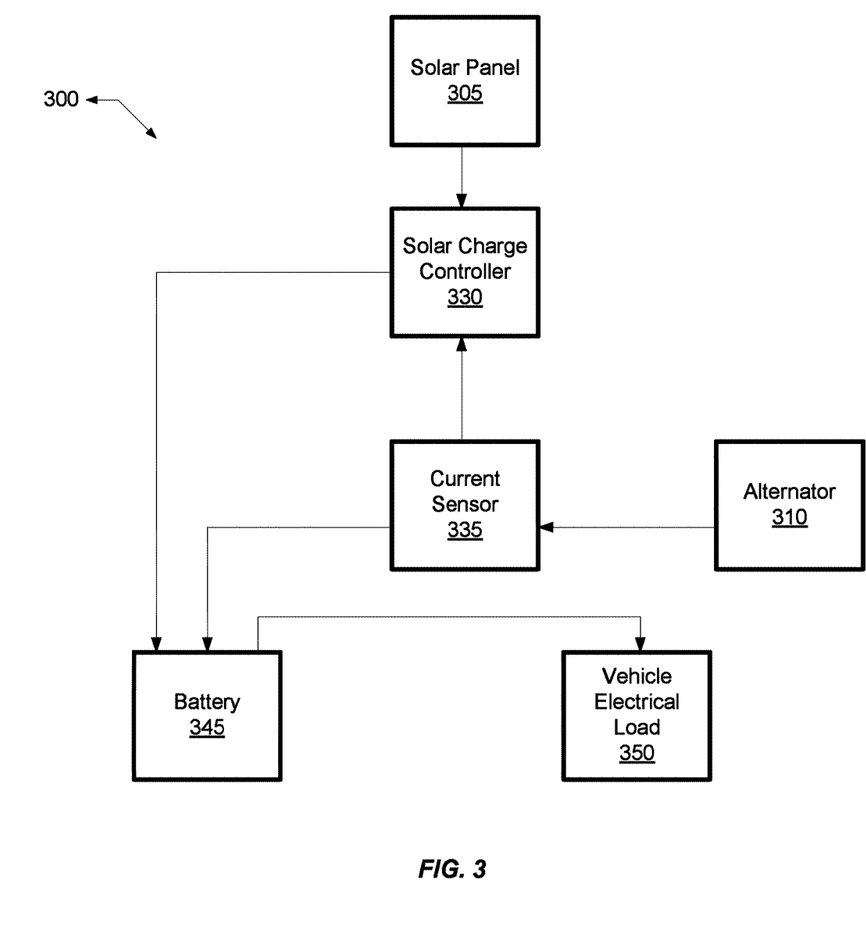
FIG. 3 is a simplified block diagram of a specific implementation of a multiple current source prioritization circuit with overvoltage protection for a vehicle.

FIG. 3 is a simplified block diagram of a specific implementation of a multiple current source prioritization circuit with overvoltage protection for a vehicle.

It should be appreciated that reference to vehicle may be in the context of a wide variety of applications, including personal, recreational, professional, commercial, or industrial uses. As nonlimiting examples, vehicle may include an automobile, such as station wagons, sedans, vans, and sport utility vehicles. A commercial vehicle can be used for the transportation of persons or the transportation of property, including packages (for example, trucks and pickups). Off highway vehicles can include racing motorcycles, trail bikes, mini bikes, dune buggies, all-terrain vehicles, jeeps, and snowmobiles. A vehicle can be a trailer coach designed for human habitation for recreational, industrial, professional, or commercial purposes that can be drawn by another vehicle. A vehicle may include a vessel such as motorboats, amphibious vessels, and inflatable vessels with motors, shuttlecraft, or jet skis. A vehicle may include aerial vehicles such as drones, personal aircraft, commercial aircraft, and so forth.

FIG. 3 depicts a system 300 having two sources of current, alternator 310 and solar panel 305, that can charge battery 345. Solar charge controller 330 controls a charging current from solar panel 305 to battery 345.

Solar panel 305 may include, for example, crystalline silicon (c-Si) solar cells made of multicrystalline and monocrystalline silicon, or thin-film solar cell arrays using cadmium telluride, CIGS or amorphous silicon.

Battery 345 can be an automotive battery, such as a SLI battery (starting-lighting-ignition battery) that is connected to vehicle electric load 350, such as a starter motor. For example, battery 345 can be a lead-acid car battery using six series-connected cells to provide a nominal 12 volt system, as often found in passenger vehicles and light trucks, or twelve cells for a 24 volt system typically used in heavy trucks or earth-moving equipment. It should be appreciated that charging all electric vehicle batteries and hybrid electric vehicle batteries are also contemplated for the techniques disclosed herein.

Solar charge controller 330 can use, for example, Maximum Power Point Tracking (MPPT), Maximum Power Point Control (MPPC), Pulse Width Modulation (PWM), or simplified DC/DC converters. In some implementations, if solar panel 305 is sized to not exceed the voltage and current maximums for battery 345, solar charge controller 330 can be eliminated altogether.

In FIG. 3, current sensor 335 can measure the output current of alternator 310 and provide feedback to solar charge controller 330. Current sensor 335 can be implemented using a wide variety of circuit designs that detect electric current (AC or DC) and generates an analog voltage or current, or one or more digital outputs. As nonlimiting examples, current sensor 335 can be implemented using Hall Effect devices, resistive devices, transformer devices, interferometric devices, fluxgate devices, coil devices, and so forth.

Solar charge controller 330 can use current sensor 335 to determine if alternator 310 is generating output current. For example, if the output of alternator 310 is 0 amps, solar charge controller 330 will remove output current limits associated with the solar panel 305 and set a voltage setpoint VSOL1 for a voltage regulator for solar charge controller 330 to a value that corresponds to an industry standard for the battery type being charged. For example, for a lead acid battery for a nominal 12 V vehicle electronics system, an industry standard value of about 13.8 to about 14 V can be used.

If the current output of alternator 310 is greater than a nominal threshold current, such as about 0.5 A, current sensor 335 can indicate the alternator 310 is supplying current. Solar charge controller 330 can use the current sensor feedback signal to set a voltage regulator setpoint to a VSOL2 value that is higher than VSOL1. For example, VSOL2 can be about 14.6 V. Solar charge controller 330 can also use the current sensor feedback signal to set solar panel 305 to have an output current limit ISOL2 such that alternator 310 outputs a current that is below the threshold alternator current. For example, as the electrical load current and battery load current change in the vehicle, alternator 310 can have an output current that will increase or decrease to match the changes. However, by having solar charge controller 330 adjust the output current limit corresponding to solar panel 305 to correspondingly increase or decrease, the output current of alternator 310 can be kept at or slightly above the threshold alternator current. This can minimize the mechanical load of alternator 310 on the engine. By tracking the output current of alternator 310 and adjusting ISOL2 such that there is no net charging current, battery 345 can be prevented from overcharging despite the voltage regulator for solar charge controller 330 being set to a voltage setpoint that is higher than the industry standard for battery 345.

Figure 4:
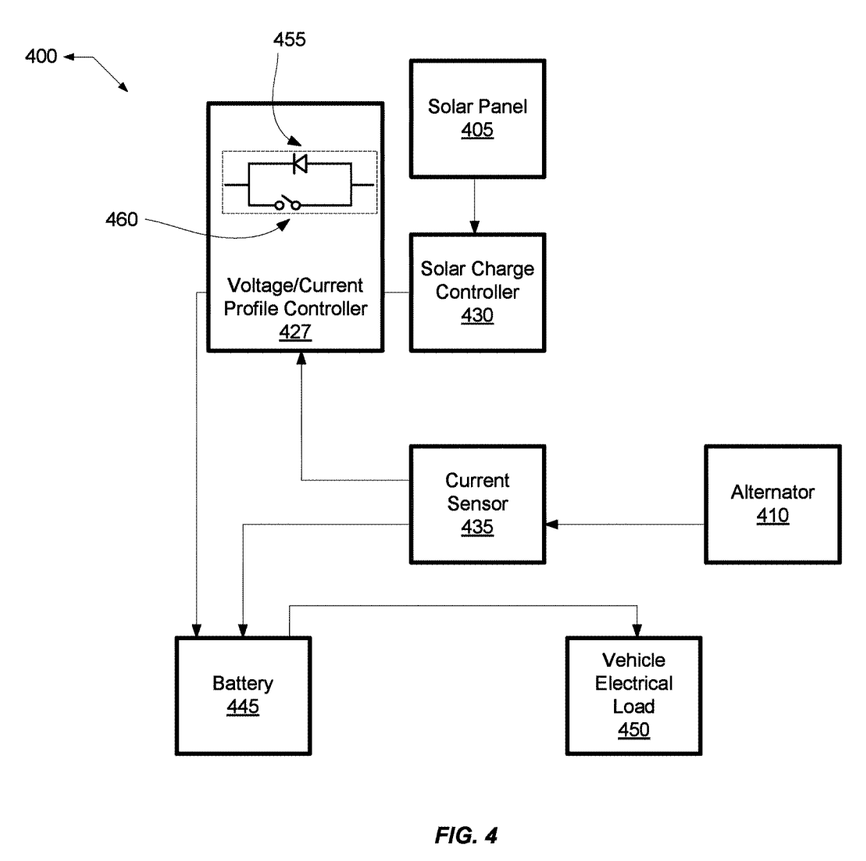
FIG. 4 is another simplified block diagram of a specific implementation of a multiple current source prioritization circuit with overvoltage protection for a vehicle.

FIG. 4 is another simplified block diagram of a specific implementation of a multiple current source prioritization circuit with overvoltage protection for a vehicle. Similar to FIG. 3, FIG. 4 depicts a system 400 having two sources of current, alternator 410 and solar panel 405, that can charge battery 445. Solar charge controller 430 controls a charging current from solar panel 405 to battery 445. Current sensor 435 determines if a vehicle engine is on by detecting if alternator 410 is generating output current.

In contrast to FIG. 3, in FIG. 4, solar charge controller 430 does not provide closed loop control based on the output of current sensor 435. Instead, the output of current sensor 435 is provided to voltage/current profile controller 427. Voltage/current profile controller 427 can use a signal from current sensor 435 to switch between two voltage setpoints, VSOL1 and VSOL2. In some implementations, providing the outputs of current sensor 435 to voltage/current profile controller 427 instead of solar charge controller 430 allows existing commercial off-the-shelf solar charge controllers to be enhanced with the current prioritization and overvoltage protection techniques described herein.

In certain implementations, current sensor 435 can include a relay circuit that is determined by a current threshold. For example, when the alternator current is less than I0, voltage/current profile controller 427 can be configured to a voltage setpoint of VSOL1. In some implementations, I0 can be about 0.5 amps, and VSOL1 about 13.8 V.

When the alternator current is above I0, corresponding to when the alternator is operating, the higher voltage setpoint of VSOL2 can be used. In some implementations, VSOL2 can be about 14.6 V. Similarly, when the alternator is operating, the output current of voltage/current profile controller 427 can be limited to a value of ISOL2 that is slightly below the minimum value of vehicle electric load 450. This causes the battery voltage to be determined by alternator 410 since there is no net charge current after the voltage setpoint for alternator 410 is reached and alternator 410 stops outputting current.

In some implementations, voltage/current profile controller 427 can include a current limiter. In other implementations, the output current of voltage/current profile controller 427 can be limited by configuring the maximum current of solar charge controller 430 or sizing solar panel 405 such that the maximum output of solar panel 405 does not exceed the minimum electrical load current.

The selection between VSOL1 and VSOL2 for voltage/current profile controller 427 can be implemented with passive devices or active devices that cause a voltage drop that can be bypassed with a relay depending on the state of the current sensor output. For example, one or more diode(s) can be matched to the voltage difference between VSOL1 and VSOL2.

FIG. 4 illustrates an example of a diode 455 and a relay 460 arranged in parallel that can be included in voltage/current profile controller 427. When current sensor 435 indicates that the alternator is on, relay 460 can be configured to short-circuit the two terminals of diode 455 in order to bypass diode 455 such that the voltage setpoint, such as VSOL1, associated with solar charge controller 430 is provided to battery 445.

When current sensor 435 indicates that the alternator is off, relay 460 can be disconnected so that the output current of solar charge controller 430 flows through diode 455, thereby causing a voltage drop such that a lower voltage value of VSOL2=VSOL1−VDIODE is provided to battery 445.

Figure 5:
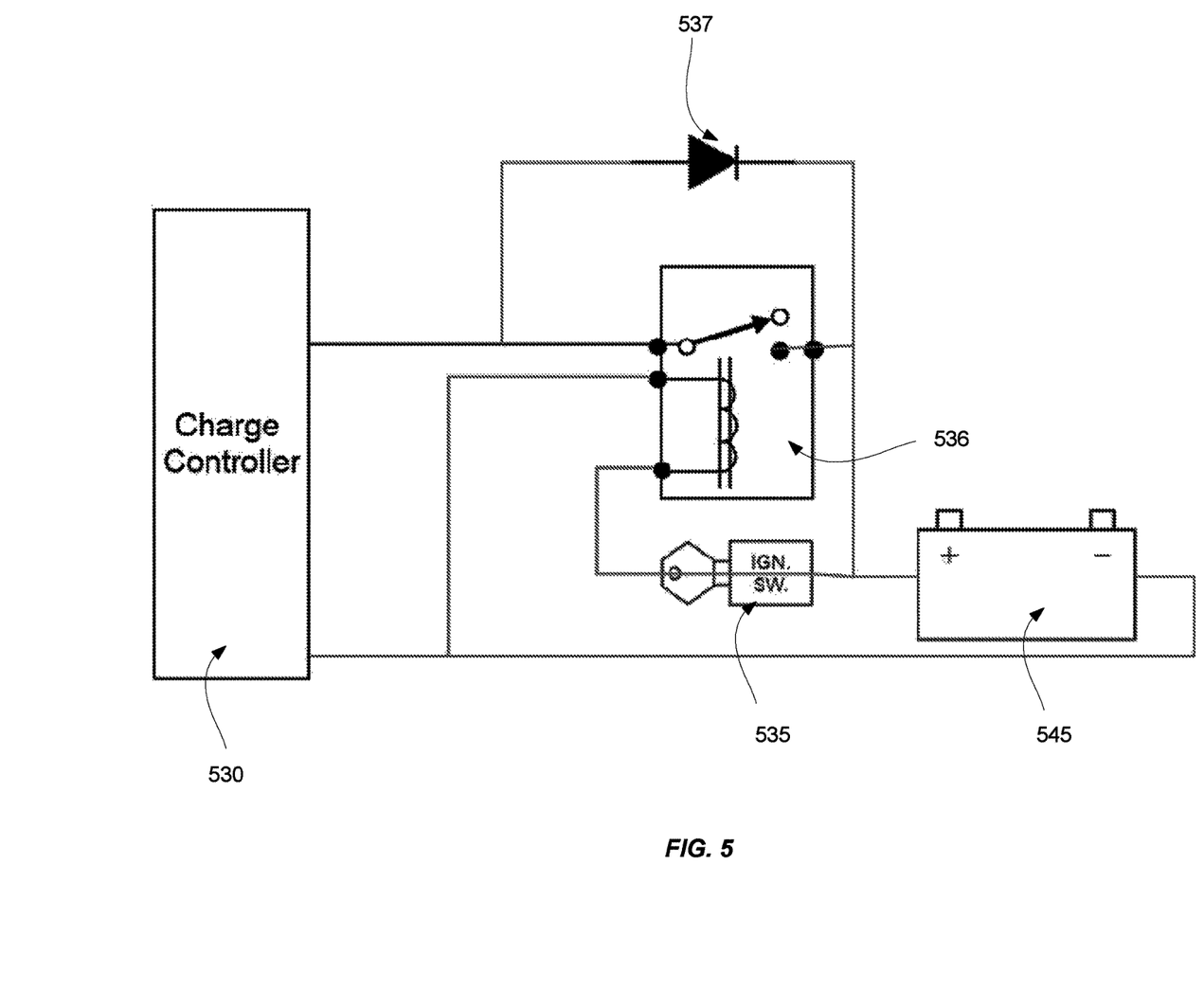
FIG. 5 is another simplified block diagram of a specific implementation of a multiple current source prioritization circuit with overvoltage protection.

FIG. 5 is yet another simplified block diagram of a specific implementation of a multiple current source prioritization circuit with overvoltage protection. In some implementations, a device that indicates the state of the vehicle and/or alternator can be used instead of or in conjunction with a current sensor. For example, the state of the vehicle and/or alternator can be determined using a vehicle seat occupancy sensor, an ignition switch sensor, a signal from a Controller Area Network (CAN) bus interface, and so forth.

As a nonlimiting example of a device for indicating the state of the vehicle, FIG. 5 depicts relay 536 that indicates whether ignition switch 535 corresponds to a vehicle engine being on or off. When ignition switch 535 indicates that the vehicle engine is on, and therefore the alternator is outputting current, the switch in relay 536 can be closed such that the output of charge controller 530 is provided to battery 545. When ignition switch 535 indicates that the vehicle engine is off, the switch in relay 536 can be opened such that the output of charge controller 530 passes through diode 537, thereby resulting in a voltage drop. The output of diode 537 can then be provided to battery 545.

In the example of FIG. 5, charge controller 530 can have a charging algorithm with a voltage setpoint of VSOL. An alternator (not shown in FIG. 5) can have a voltage regulator with a voltage setpoint of VALT. These two voltages, VALT and VSOL, can vary depending on environmental conditions and the make/model of the alternator and charge controller 530. Consequently, for a given system with off the shelf components, VALT can be less than or equal to or greater than VSOL. This gives rise to inconsistencies in the percentage of power delivered from each source and the final battery voltage if VALT and VSOL are different.

When the current of charge controller 530 can be limited to less than the electric load current and the voltage setpoint VSOL of charge controller 530 can be increased to be greater than VALT, the current contribution from charge controller 530 will be maximized and the alternator current will be minimized while allowing the alternator to regulate the final battery voltage. This reduces the mechanical load on the engine which increases fuel efficiency. Battery 545 will continue to be charged in accordance with the vehicle charging system design since the alternator will regulate the final battery voltage.

In certain implementations, the source hardware and control functions can be integrated into the charge controller 530. In some implementations, the source hardware and control functions can be integrated into the vehicle electrical/electronic system and/or other higher level system.

While the description above chiefly describes systems having a single battery, the techniques may be used with multiple batteries. For example, a system according to certain implementations may include multiple crank batteries or one or more crank batteries coupled with one or more auxiliary batteries. In some implementations, one or more crank batteries and one or more auxiliary batteries can be installed with an electrical switching device.

It should be noted that certain implementations of the multiple current source prioritization circuits with overvoltage protection as described herein can meet the growing need for high efficiency energy systems. Multiple current source prioritization circuits having the characteristics as described herein are important for the continuing evolution of fuel efficiency standards for automotive, maritime, aviation, and other applications. Various implementations described herein may be implemented using any in a variety of standard or proprietary discrete electronics or integrated semiconductor processes. In addition, it should be noted that implementations are contemplated that may employ a much wider range of semiconductor materials and manufacturing processes including, for example, CMOS, GaAs, SiGe, etc. The multiple current source prioritization circuits with overvoltage protection as described herein may be represented (without limitation) in software (object code or machine code in non-transitory computer-readable media), in varying stages of compilation, as one or more netlists (e.g., a SPICE netlist), in a simulation language, in a hardware description language (e.g., Verilog, VHDL), by a set of semiconductor processing masks, and as partially or completely realized semiconductor devices (e.g., an ASIC). Some implementations may be a standalone integrated circuit, while others may be embedded as part of larger system, module, or vehicle.

It will be understood by those skilled in the art that changes in the form and details of the implementations described above may be made without departing from the scope of this disclosure. In addition, although various advantages have been described with reference to some implementations, the scope of this disclosure should not be limited by reference to such advantages. Rather, the scope of this disclosure should be determined with reference to the appended claims.

What is claimed is:

1. A multiple current source prioritization circuit that prevents a battery from charging to a voltage above a first voltage setpoint for a first voltage regulator, comprising:
   a first input configured to interface to an alternator having the first voltage regulator;
   a second input configured to interface to a solar panel having a second voltage regulator;
   a first output configured to interface to the battery having a charge/discharge current and to a load having a load current;
   first circuitry configured to detect that the alternator is in a first state, the first state corresponding to the first voltage setpoint for the first voltage regulator; and
   second circuitry configured to:
      when the first circuitry represents that the alternator is in the first state,
         set the second voltage regulator to a second voltage setpoint higher than the first voltage setpoint;
         and set a first current limit at an output of the second voltage regulator below the load current, wherein:
            a first current at the first output includes an amount of current from the solar panel corresponding to the first current limit.

2. The multiple current source prioritization circuit of claim 1, wherein the second voltage setpoint is higher than the first voltage setpoint by at least 0.2 Volts.

3. The multiple current source prioritization circuit of claim 1, wherein the second voltage setpoint is higher than the first voltage setpoint by at least 0.5 Volts.

4. The multiple current source prioritization circuit of claim 1, wherein the first circuitry comprises at least one of: a vehicle seat occupancy sensor, a current sensor, an ignition switch sensor, a Controller Area Network bus interface, an engine RPM sensor, a mass air flow sensor, a fuel flow sensor, an $O_2$ sensor, an oil pressure sensor, a sensor configured to detect a PWM signal from fuel injectors, a sensor configured to detect electrical noise detected on 12/24 volt system from an ignition coil, a frequency sensor, a speed sensor, a sensor configured to detect a threshold battery voltage, and a sensor configured to detect a signal between the alternator and a control module interface.

5. The multiple current source prioritization circuit of claim 1, wherein the second circuitry is further configured to:
   when the first circuitry represents that the alternator is not in the first state:
      set the second voltage regulator to a third voltage setpoint, the third voltage setpoint being lower than the second voltage setpoint.

6. The multiple current source prioritization circuit of claim 5, wherein the first voltage setpoint is about 14.0 Volts, the second voltage setpoint is about 14.6 Volts, and the third voltage setpoint is about 13.8 Volts.

7. The multiple current source prioritization circuit of claim 1, further comprising:
   a third input configured to interface to a third current source having a third voltage regulator;
   wherein the second circuitry is further configured to:
      when the first circuitry represents that the alternator is in the first state,
         set the third voltage regulator to a third voltage setpoint higher than the first voltage setpoint and lower than the second voltage setpoint.

8. The multiple current source prioritization circuit of claim 1, wherein the second circuitry is further configured to:
   when the first circuitry represents that the alternator is not in the first state:
      set a second current limit at an output of the second voltage regulator, the second current limit being above the load current.

9. The multiple current source prioritization circuit of claim 1, wherein the second circuitry further comprises a diode and a switch arranged in parallel, the diode and the switch being positioned between the second voltage regulator and the battery:
   and wherein the second circuitry is further configured to:
      when the first circuitry represents that the alternator is not in the first state:
         open the switch.

10. The multiple current source prioritization circuit of claim 1, wherein the solar panel corresponds to a flexible thin-film solar cell array mounted on a vehicle.

11. The multiple current source prioritization circuit of claim 1, wherein the first state corresponds to an amount of current from the alternator that is greater than 0.5 Amperes.

12. The multiple current source prioritization circuit of claim 1, wherein the second circuitry is integrated into a solar charge controller coupled to the solar panel.

13. The multiple current source prioritization circuit of claim 1, wherein the second circuitry is integrated into a vehicle electronics system.

14. The multiple current source prioritization circuit of claim 1, wherein the solar panel is sized to have a maximum current output below a minimum value of the load current.

15. The multiple current source prioritization circuit of claim 1, further comprising:
   third circuitry configured to monitor an increased current generated by the alternator, the increased current generated by the alternator corresponding to an increased load current;
   wherein the second circuitry is further configured to:
      set a second current limit at an output of the second voltage regulator below the increased load current, wherein:
         a second current at the first output includes an amount of current from the solar panel corresponding to the second current limit.

16. A current source prioritization system that prevents a battery from charging to a voltage above a first voltage setpoint for a first voltage regulator, comprising:
   an alternator having the first voltage regulator;
   a solar panel having a second voltage regulator;
   a battery having a charge/discharge current;
   a load having a load current;
   a first output configured to interface to the battery and the load;
   first circuitry configured to detect that the alternator is in a first state, the first state corresponding to the first voltage setpoint for the first voltage regulator;
   second circuitry configured to:
      when the first circuitry represents that the alternator is in the first state,
         set the second voltage regulator to a second voltage setpoint higher than the first voltage setpoint;

and set a first current limit at an output of the second voltage regulator below the load current, wherein:
a first current at the first output includes an amount of current from the solar panel corresponding to the first current limit.

17. A vehicle including a current source prioritization system that prevents a battery from charging to a voltage above a first voltage setpoint for a first voltage regulator, comprising:
an alternator having the first voltage regulator;
a solar panel having a second voltage regulator;
a battery having a charge/discharge current;
a load having a load current;
a first output configured to interface to the battery and the load;
first circuitry configured to detect that the alternator is in a first state, the first state corresponding to the first voltage setpoint for the first voltage regulator;
second circuitry configured to:
when the first circuitry represents that the alternator is in the first state,
set the second voltage regulator to a second voltage setpoint higher than the first voltage setpoint;
and set a first current limit at an output of the second voltage regulator below the load current, wherein:
a first current at the first output includes an amount of current from the solar panel corresponding to the first current limit.

\* \* \* \* \*